United States Patent
Arrington et al.

(10) Patent No.: US 11,798,844 B1
(45) Date of Patent: Oct. 24, 2023

(54) HIGH ASPECT RATIO GRATINGS FABRICATED BY ELECTRODEPOSITION

(71) Applicant: National Technology & Engineering Solutions of Sandia, LLC, Albuquerque, NM (US)

(72) Inventors: Christian Lew Arrington, Albuquerque, NM (US); Amber Lynn Dagel, Lafayette, CO (US); Patrick Sean Finnegan, Albuquerque, NM (US); Andrew E. Hollowell, Albuquerque, NM (US); Travis Ryan Young, Albuquerque, NM (US); Kalin Baca, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 105 days.

(21) Appl. No.: 17/503,144

(22) Filed: Oct. 15, 2021

Related U.S. Application Data

(60) Provisional application No. 63/094,450, filed on Oct. 21, 2020.

(51) Int. Cl.
| | |
|---|---|
| *H01L 21/70* | (2006.01) |
| *H01L 21/768* | (2006.01) |
| *C25D 3/48* | (2006.01) |
| *H01L 21/3063* | (2006.01) |

(52) U.S. Cl.
CPC .......... *H01L 21/76847* (2013.01); *C25D 3/48* (2013.01); *H01L 21/3063* (2013.01); *H01L 21/76873* (2013.01); *H01L 21/76877* (2013.01)

(58) Field of Classification Search
None
See application file for complete search history.

(56) References Cited

U.S. PATENT DOCUMENTS 10,147,510 B1  12/2018  Rowen et al.

OTHER PUBLICATIONS

Shi et al. "Towards the Fabrication of High-Aspect-Ratio Silicon Gratings by Deep Reactive Ion Etching" Micromachines, 11, 864 pange 1-13 (Year: 2020).*

Josell, D. et al., "Accelerated Bottom-Up Gold Filling of Metallized Trenches," Journal of the Electrochemical Society, 2019, vol. 166, pp. D487-D495.

Hollowell, A. E. et al., "Double Sided Grating Fabrication for High Energy X-Ray Phase Contrast Imaging," Materials Science in Semiconductor Processing, 2019, vol. 92, pp. 86-90.

(Continued)

*Primary Examiner* — Bradley Smith
(74) *Attorney, Agent, or Firm* — Martin I. Finston; Mark A. Dodd

(57) ABSTRACT

A method is provided for making gratings of gold or other metal in silicon substrates. The disclosed method may achieve high aspect ratios. According to the disclosed method, a silicon wafer is through-etched. A seed layer of metal is vapor-deposited on one side of the wafer, and a layer of metal is electrodeposited on the seed layer. The electrodeposited metal plugs the trenches and provides a conductive surface for subsequent electrodeposition. The trenches are then filled by electrodeposition from within the trenches, so that the walls of the metal grating grow on the metal plugs.

10 Claims, 7 Drawing Sheets

(56) References Cited

OTHER PUBLICATIONS

Finnegan, P. S. et al., "High Aspect Ratio Anisotropic Silicon Etching for X-Ray Phase Contrast Imaging Grating Fabrication," Materials Science in Semiconductor Processing, 2019, vol. 92, pp. 80-85.

Nusse, D. et al., "Megasonic Enhanced KOH Etching for {110} Silicon Bulk Micromachining," Proc. SPIE 5602, Optomechatronic Sensors, Actuators, and Control, Oct. 25, 2004, 9 pages; doi.org/10.1117/12.570220.

Finnegan, P. S. et al., "Fabrication of Extremely High Aspect Ratio Diffraction Gratings for X-Ray Phase Contrast Imaging," 2018, SAND2018-10866C, Sandia National Laboratories, Albuquerque, NM, 21 pages.

Finnegan, P. S. et al., "Fabrication of Extremely High Aspect Ratio Diffraction Gratings for X-Ray Phase Contrast Imaging," 2019, SAND2019-5951PE, Sandia National Laboratories, Albuquerque, NM, 35 pages.

Finnegan, P. S. et al., "High Aspect Ratio Silicon Template Fabrication for 100 keV X-Ray Phase Contrast Imaging," 2019, SAND2019-6435A, Sandia National Laboratories, Albuquerque, NM, 2 pages.

Hollowell, A. E. et al., "Novel Plating Approaches for Grating Fabrication: Conformal Deposition, through Mask Filling, and Superfilled Electrodeposition," SAND2019-6436A, Sandia National Laboratories, Albuquerque, NM, 3 pages.

Hollowell, A. E. "Utilizing Electroplating for High Aspect Ratio Mesoscale Fabrication—Filling, Forming, and Coating," 2019, SAND2019-9803C, Sandia National Laboratories, Albuquerque, NM, 71 pages.

Hollowell, A. E. et al., "Novel Plating Approaches for Grating Fabrication: Conformal Deposition, through Mask Filling, and Superfilled Electrodeposition," 2019, SAND2019-12550C, Sandia National Laboratories, Albuquerque, NM, 1 page.

Finnegan, P. S. et al., "High Aspect Ratio Silicon Template Fabrication for 100 keV X-Ray Phase Contrast Imaging," 2019, SAND2019-12551C, Sandia National Laboratories, Albuquerque, NM, p. 1.

\* cited by examiner

US 11,798,844 B1

HIGH ASPECT RATIO GRATINGS FABRICATED BY ELECTRODEPOSITION

CROSS-REFERENCE TO RELATED APPLICATION

This application claims priority to U.S. Provisional Application Ser. No. 63/094,450, filed Oct. 21, 2020 under the title, "HIGH ASPECT RATIO GRATINGS FABRICATED BY ELECTRODEPOSITION," the entirety of which is hereby incorporated herein by reference.

STATEMENT OF GOVERNMENT RIGHTS

This invention was developed under Contract No. DE-NA0003525 awarded by the United States Department of Energy/National Nuclear Security Administration. The Government has certain rights in this invention.

ART BACKGROUND

As x-ray phase-contrast and Talbot-Lau imaging techniques continue to develop, extension to higher energies is envisaged, not least because greater energies offer deeper x-ray penetration into objects and improved imaging characteristics. As the desired energies increase, however, so does the grating thickness needed to enable this technology. The required x-ray-absorbing gratings are typically made of high-atomic-number ("high-Z") x-ray absorbing metals such as gold. Typical feature sizes are less than 5 µm, and typical grating periods are less than 20 µm. In typical implementations, these features may be patterned over an area as large as 64 mm$^2$ or more. Because of the metal thicknesses needed for x-ray attenuation, the aspect ratio, i.e., the height-to-width ratio, of a grating for x-ray imaging may be as much as 50 or more.

Numerous technical articles relating to the fabrication of x-ray gratings have been published. Several articles of particular relevance to the techniques that we will describe here are listed below.

D. Josell et al., "Accelerated Bottom-Up Gold Filling of Metallized Trenches," *Journal of The Electrochemical Society* 166 (12) D487-D495 (2019).

A. E. Hollowell et al., "Double sided grating fabrication for high energy X-ray phase contrast," *Mat. Sci. in Semic. Proc.* 92 (2019) 86-90.

P. Finnegan et al., "High aspect ratio anisotropic silicon etching for x-ray phase contrast imaging grating fabrication," *Mat. Sci. in Semic. Proc.* 92 (2019) 80-85.

The entirety of each of the above publications is hereby incorporated herein by reference.

To fabricate high-aspect-ratio (HAR) gratings useful in applications such as x-ray imaging, a common approach is to prepare a mold and fill it with metal to form the walls of the grating. At high aspect ratios, however, the fine feature size challenges the structural integrity of the molds. This has been a problem especially when the molds are made of photoresist, but even silicon molds can be very delicate and difficult to handle for that reason.

Further difficulties have been encountered with the process of metal deposition within the molds. Shadowing within the narrow trenches between the walls of the mold, for example, can interfere with the vapor deposition of metal.

Still further, although the relative rigidity of silicon makes it a promising material for making molds, the etching of deep trenches in a silicon substrate at very high aspect ratios has also met with challenges.

For these and other reasons, there is a continuing quest for new and improved processes useful in the fabrication of metal gratings at high aspect ratios.

SUMMARY OF THE INVENTION

We have developed a new approach for making gold or other metal gratings in silicon substrates. Our approach offers the possibility to achieve very high aspect ratios. In our approach, a silicon wafer is through-etched; that is, the etched trenches for the mold extend all the way from one face of the wafer to the other. To fill the trenches, we employ a unique fabrication technique: A seed layer of metal is vapor-deposited on one side of the wafer, here referred to as the backside. By electrodeposition on the seed layer, we form a layer of metal that plugs the back ends of the trenches and provides a conductive surface for subsequent electrodeposition. We then fill the trenches by electrodeposition from within the trenches, so that the walls of the metal grating grow on the metal plugs.

Accordingly, a first embodiment of the invention involves lithographically defining a grating pattern comprising parallel elongated etch regions of equal widths on a first face of a silicon substrate. In examples, the substrate thickness is fifty or more times the etch region width. The first silicon face is anisotropically etched, so as to create a multiplicity of parallel trenches. In one approach, the trenches are etched all the way through the substrate in a single step. In another approach, the trenches are etched partway through the substrate, from front to back. Then, a layer of material is removed from the back of the substrate to a depth that exposes the bottoms of the trenches.

At one face of the substrate, the through-etched trenches are plugged with electrodeposited metal. The through-etched trenches are then filled with electrodeposited metal by growth from the plugged face. In an illustrative example, the electrodeposited metal fill is gold. Other possible compositions for the metal fill include, without limitation, copper and nickel.

In embodiments, a metal seed layer for the electrodeposition that plugs the trenches is evaporatively deposited. Before depositing the seed layer, a dielectric material may be coated onto the inner walls of the through-etched trenches. A non-limiting example for the dielectric material is aluminum oxide, which may be deposited by, e.g., atomic layer deposition.

In embodiments, the through-etched trenches are at least 0.8 cm long, and the grating pattern is at least 0.8 cm across.

In various embodiments, the through-etched trenches are at least 600 µm deep, and/or they have a pitch of 20 µm or less.

In embodiments, the through-etched trenches are separated by silicon walls with a thickness of 5 µm or less.

BRIEF DESCRIPTION OF THE DRAWINGS

In FIG. 3A, gold overplating is visible on the top side of the die. In FIG. 3B, the gold overplating has been removed by chemical-mechanical polishing (CMP).

FIG. 4A shows the wafer prior to any electrodeposition. FIG. 4B shows the wafer after electrodeposition of gold to fill the gaps in the bottoms of the silicon trenches.

DETAILED DESCRIPTION

Our process sequence, in an illustrative embodiment, is now described with reference to FIGS. 1A-1F. The product, in this non-limiting example, is a gold grating with a pitch of 12 µm, formed by electrodeposition within a silicon mold. The silicon sidewalls between the trenches of the mold have a width of 4 µm. These dimensions would produce a grating with a duty cycle (i.e., the ratio of gold area to silicon area) of about 67%.

Fabrication starts with a six-inch wafer 10 of [110] silicon with a thickness of 675 µm.

Figure 1A:
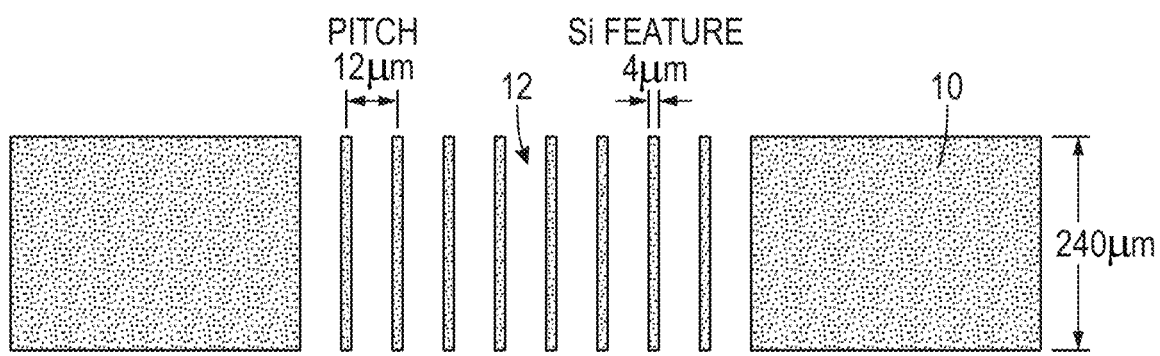
FIGS. 1A-1F are schematic cross-sectional views illustrating a process sequence for making an x-ray grating by methods described herein.
Figure 1B:
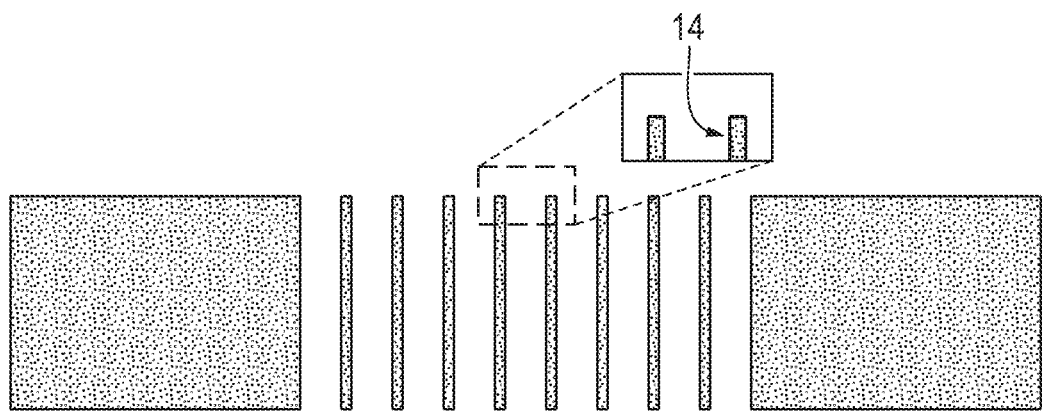
Figure 1C:
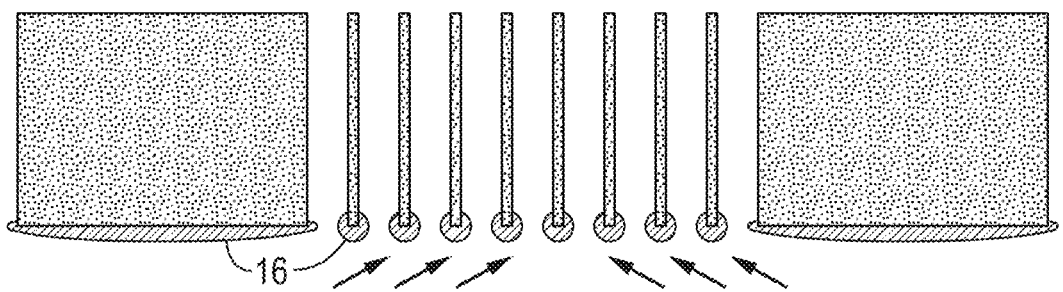
Figure 1D:
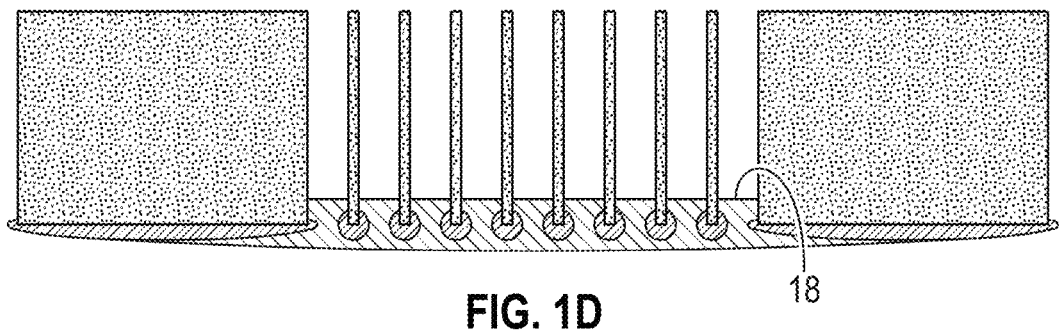

The wafer is patterned on the front side with a photoresist using a 1×lithography process to create an array of die over the face of the wafer. Each die is sized 0.8 cm×0.8 cm and is patterned with grating features that are advantageously less than 20 µm in size. As noted above, the specific example described here, as illustrated in FIG. 1A, has a 12-µm pitch and a 4-µm silicon sidewall thickness. Arrays of approximately sixty die have been defined in this manner over single six-inch wafers.

Trenches 12 are then through-etched in the silicon. In one possible approach, the process begins with deep reactive ion etching (DRIE) to cut trenches partway through the silicon wafer. For example, we found in trials that trenches up to 250 µm deep could be cut in this manner. The wafer is then inverted to be processed on the backside. The entire backside of the wafer is removed by DRIE to a depth of 425 µm or more, so that the etch lands on the front-side etched features. The end result is shown in cross-sectional view in FIG. 1A. In the illustrated example, the remaining wafer is 240 µm thick and has fully through-etched trenches.

In an alternative approach, megasonic potassium hydroxide (KOH) etching can be used in place of DRIE. Megasonic KOH etching is described, for example, in D. Nusse et al., "Megasonic enhanced KOH etching for {110} silicon bulk micromachining", Proc. SPIE 5602, Optomechatronic Sensors, Actuators, and Control (25 Oct. 2004); https://doi.org/10.1117/12.570220, the entirety of which is hereby incorporated herein by reference. Megasonic etching uses ultrasound at megahertz frequencies to mitigate the effects of hydrogen evolution during silicon etching. It is useful for, e.g., enhancing reproducibility when etching trenches as high aspect ratio and for reducing roughness at the bottoms of the trenches. In trials, we found that higher aspect ratios could be achieved with megasonic etching than with DRIE. Accordingly, it may even be possible to cut through a silicon wafer of 250-µm thickness, or even more, in a single etching step by megasonic etching.

Alumina (aluminum oxide) 14 is then deposited from one side of the wafer, using angled atomic layer deposition (ALD) with rotation. In the schematic cross-sectional view of FIG. 1B, for example, one representative sidewall is shown with the resulting alumina coating. The alumina deposition creates an insulating layer over the etched silicon template, which prevents plating on the sidewalls so that the electroplating will proceed only from the bottom up in subsequent processing steps.

An electron-beam metal evaporator is then used to deposit a seed layer 16, constituted by a thin-film metal stack of titanium and gold, on one side of the wafer. By way of illustration, the alumina dielectric may be deposited by ALD from the front of the wafer (i.e., the side from which the etching took place), followed by deposition of the seed layer from the back side of the wafer.

The seed layer is deposited by angled evaporation directed at an angle of 45° from the source. This is illustrated in the schematic cross-sectional view of FIG. 1C. The seed layer is deposited across the face of the wafer, but it still leaves micrometer-sized gaps between the alumina-coated silicon sidewalls. Thus, as is desirable, the seed layer can be deposited without physically or electrically connecting the grating features.

On the same side of the wafer as the seed layer, the micrometer-sized gaps between the sidewalls are then plugged (i.e., closed off) by using a gold electroplating process. This creates a uniform conductive base layer 18 across the wafers, as shown in the schematic cross-sectional view of FIG. 1D.

Figure 2A:
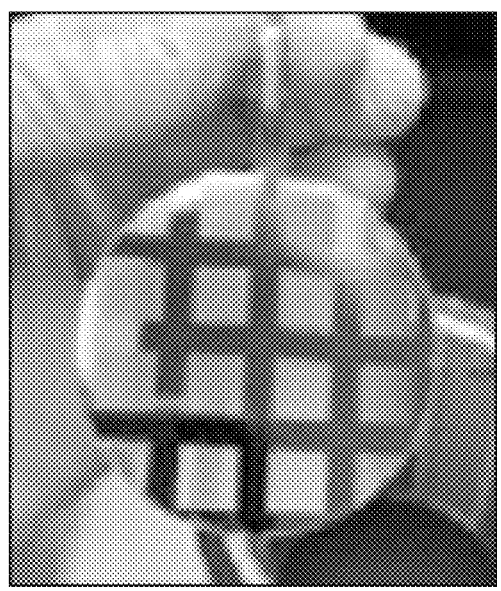
FIGS. 2A-2C are photographic images illustrating three sequential stages in the fabrication of an example wafer.

A plan view of a 50-mm wafer after the formation of the base layer is shown in FIG. 2A. It should be noted in this regard that in trials, we demonstrated that our process could readily be scaled from 50-mm wafers to 150-mm (six-inch) wafers.

Figure 1E:
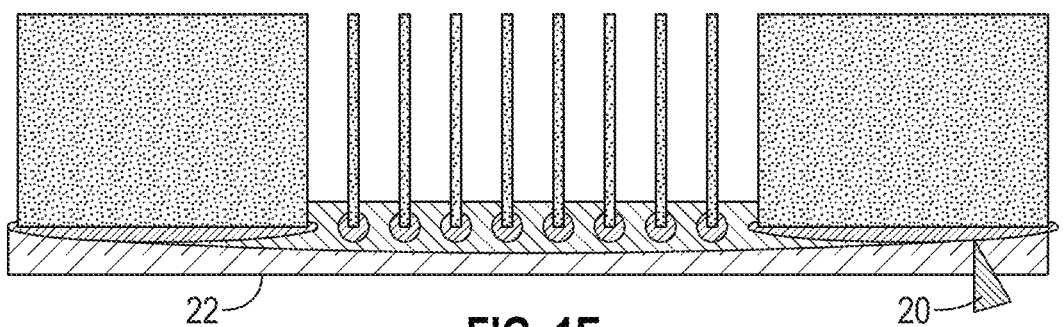
Figure 1F:
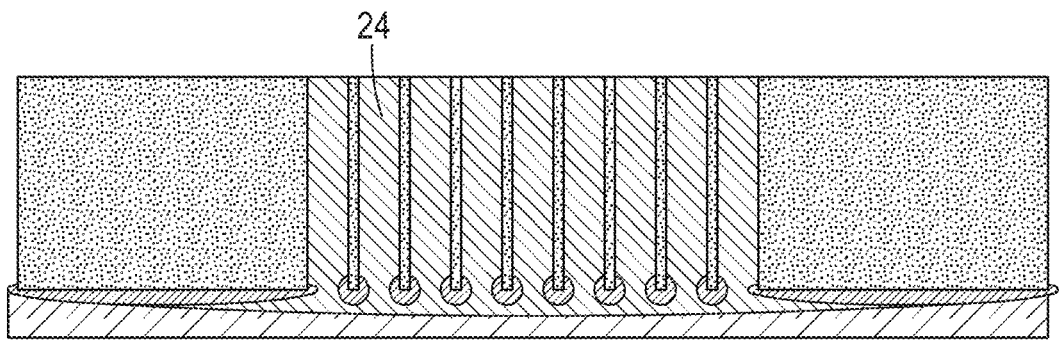
Figure 2B:
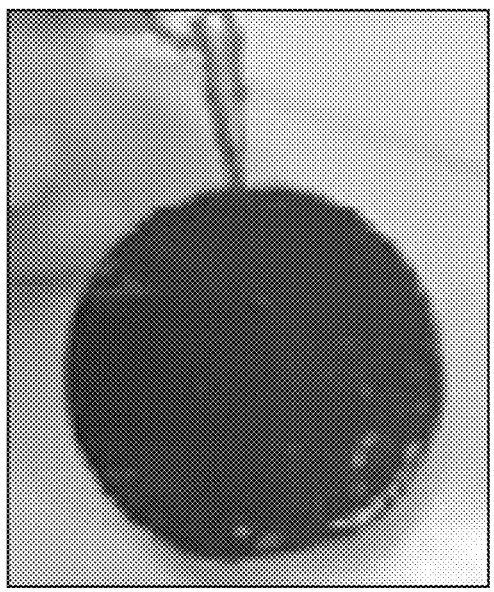
Figure 2B:

As indicated in FIG. 1E, electrical contact 20 is made to the base layer. The base layer is then masked with an insulating epoxy 22 to prevent backside gold electroplating. A plan view of a 50-mm wafer after masking with insulating epoxy is shown in FIG. 2B. A back view is shown on the left, and a front view is shown on the right in the figure.

Figure 2C:
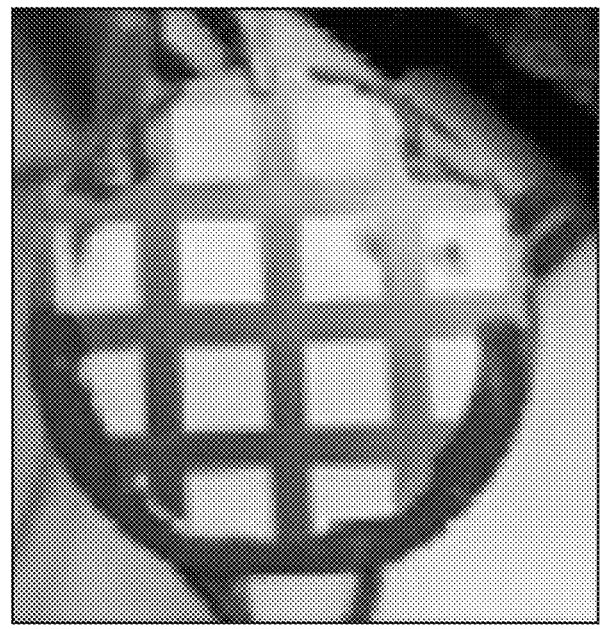

The trenches are then filled from the plugged bottom ends to the top ends by gold electroplating. The resulting gold fill 24 is shown schematically in the cross-sectional view of FIG. 1F. A plan view of a 50-mm wafer after gold electrofilling is shown in FIG. 2C.

In one illustrative example, plating continues for 26 hours at a current of 79 mA.

Figure 3A:
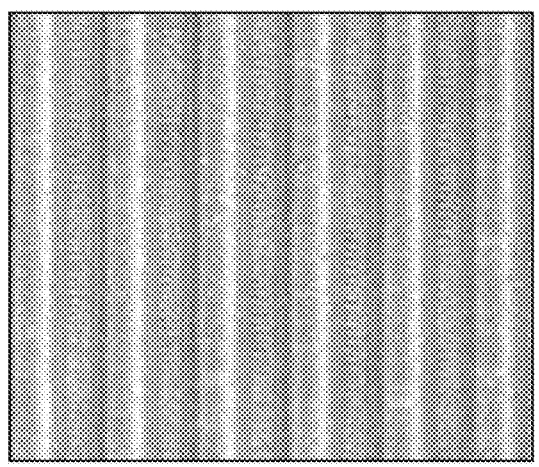
FIGS. 3A and 3B are microscope images of a gold grating deposited by electrofilling at two sequential stages of fabrication.
Figure 3B:
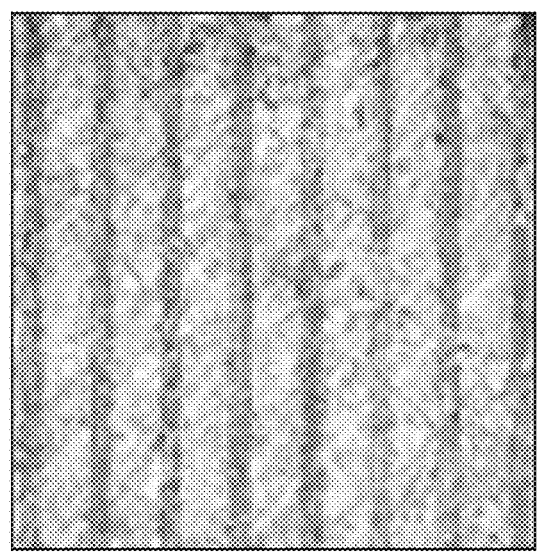

The gold electroplating step will typically overfill the mold. FIG. 3A, for example, shows a plan view of a filled grating with gold overplating visible on the top side of the die. Accordingly, a chemical-mechanical polish (CMP) is typically used to remove excess gold from the front side as well as the backside of the wafer. The CMP step is important in making x-ray gratings, for example, because gold overplating could otherwise add excess attenuation of the x-ray beam. FIG. 3B shows a plan view of a filled grating after CMP.

In an example CMP procedure, the die are mounted to a parallel polishing fixture using double-sided tape. In trials, we found that the tape bond would endure throughout the process, provided there was no gold overplating on the bottom of the die.

A 1200 fine grit silicon carbide abrasive disc, with water, is then used to do an initial cut of the gold surface to bring it down to the level of the silicon. This process is performed, e.g., at 150 rpm with oscillation and rotation of the polishing head for 20 minutes. The down force applied is set, e.g., to 2.85 N/cm². For a gold surface area of 0.64 cm², this areal force is equivalent to a weight setting on the polishing tool of 187 g.

In our trials, we used digital microscope imaging to verify when the gold had been made flush with the silicon. After verification, and in view of the resulting increase in effective surface area, we increased the weight setting to 420 g for further polishing. We polished for another hour until the die measured in the range of 200 μm thick. Polishing is done, e.g., with a 9-μm slurry.

As pointed out above, electroforming molds of the prior art have been prone to deform at high aspect ratios because of insufficient rigidity of the sidewall material. One known mitigation strategy is to incorporate lateral relief structures in the design of the grating.

For example, each trench in the grating may be periodically interrupted by a linear array of endwalls that extend from sidewall to sidewall and divide the trench into a series of narrow cells. The endwall arrays may be staggered such that, for example, each endwall in one trench is aligned halfway between two endwalls in the trench to its right and in the trench to its left. The endwalls in such an arrangement constitute the lateral relief structures.

Our prototype silicon molds have generally be sturdy enough that lateral relief structures were not needed. However, for applications in which lateral relief structures are desirable, they can readily be incorporated in our molds without substantial change to the fabrication sequences described above. This may be especially advantageous when very high aspect ratios are desired.

EXAMPLE

Figure 4A:
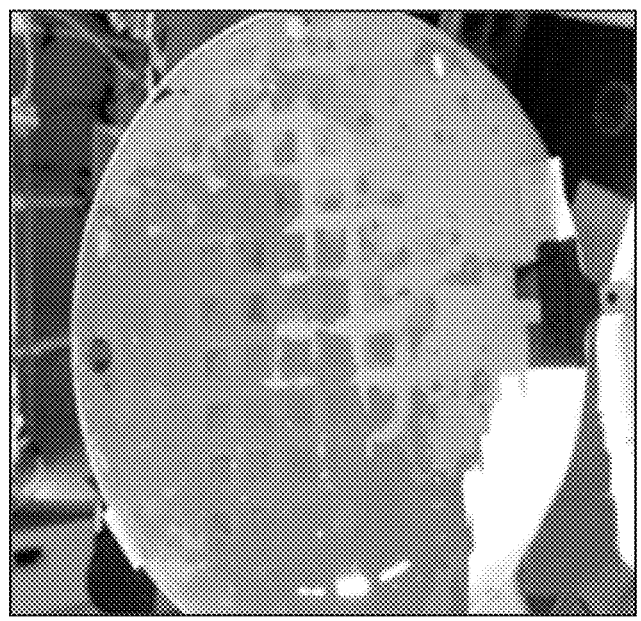
FIGS. 4A and 4B are photographic views of an array of 0.8 cm×0.8 cm die fabricated on a 6-inch wafer.
Figure 4B:
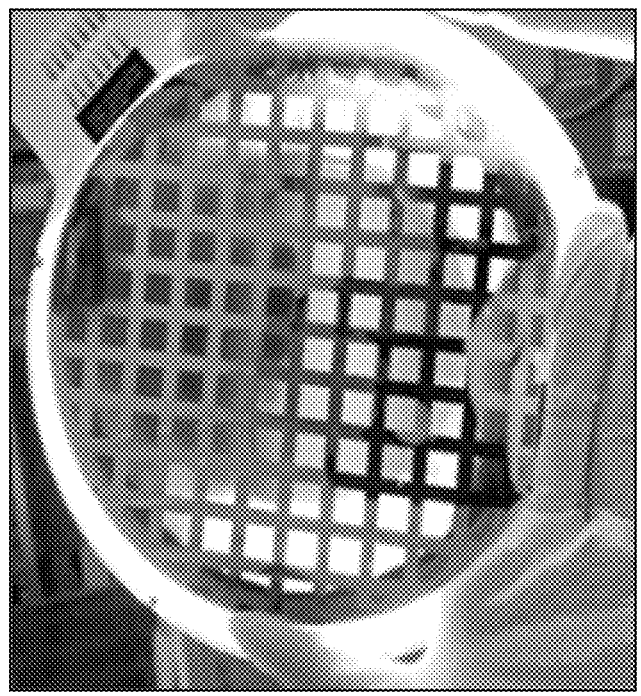

FIG. 4A is a photographic view of an array of 0.8 cm×0.8 cm through-etched die fabricated on a 6-inch wafer prior to the gold electrofilling, shown with backside illumination and with the front side facing the camera. FIG. 4B is a backside view of the wafer, showing electroplated gold that fills the gaps in the bottoms of the silicon trenches and blocks light from the source located behind the wafer.

Figure 5:
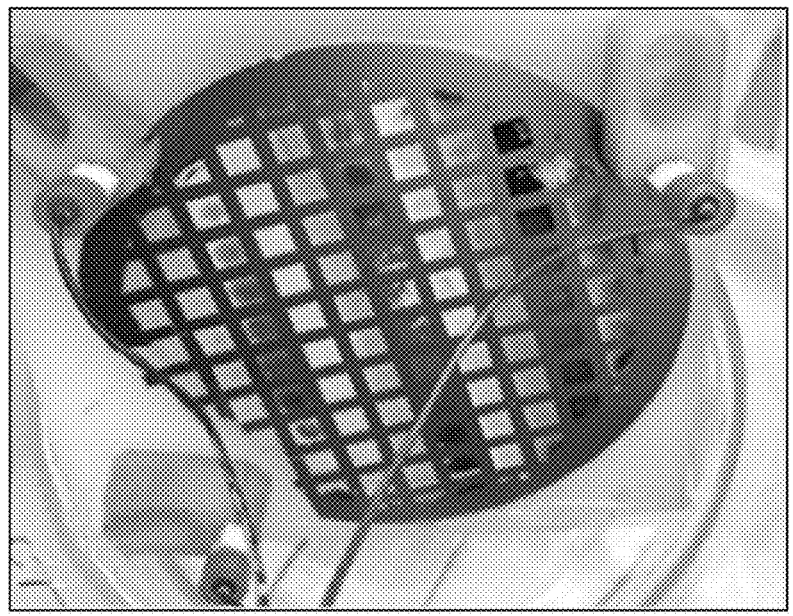
FIG. 5 is a photographic view of the wafer of FIGS. 4A and 4B after filling with electroplated gold.
Figure 6A:
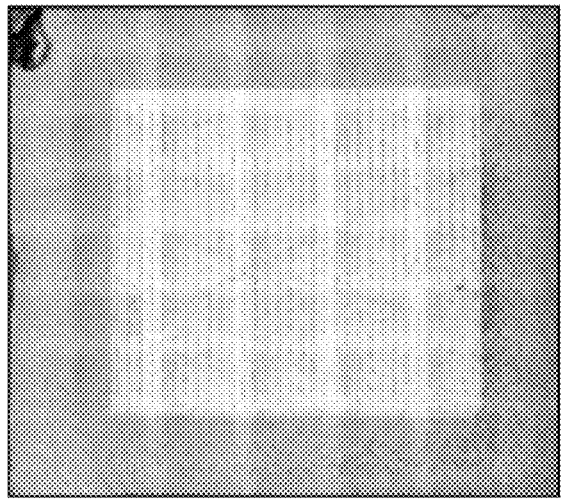
FIGS. 6A and 6B are magnified die-level views, covering an area of 1.2 cm$^2$, of one fully fabricated and singulated die.
Figure 6B:
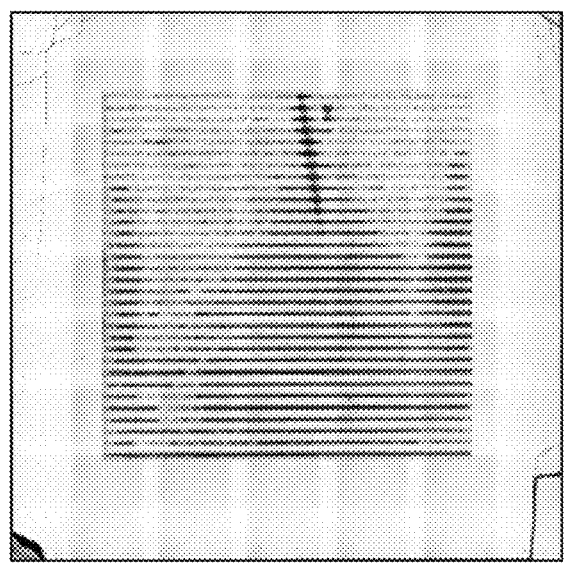

FIG. 5 is a front-side view showing the trenches after filling with electroplated gold. FIGS. 6A and 6B are magnified die-level views, covering an area of 1.2 cm², of one singulated die. The views in FIGS. 6A and 6B are rotated 90° from each other, and the resulting difference in illumination reveals complementary details. A coarse grid visible as a ghost image in these two views is an artifact of the imaging procedure, due to the stitching together of multiple frames.

Figure 7:
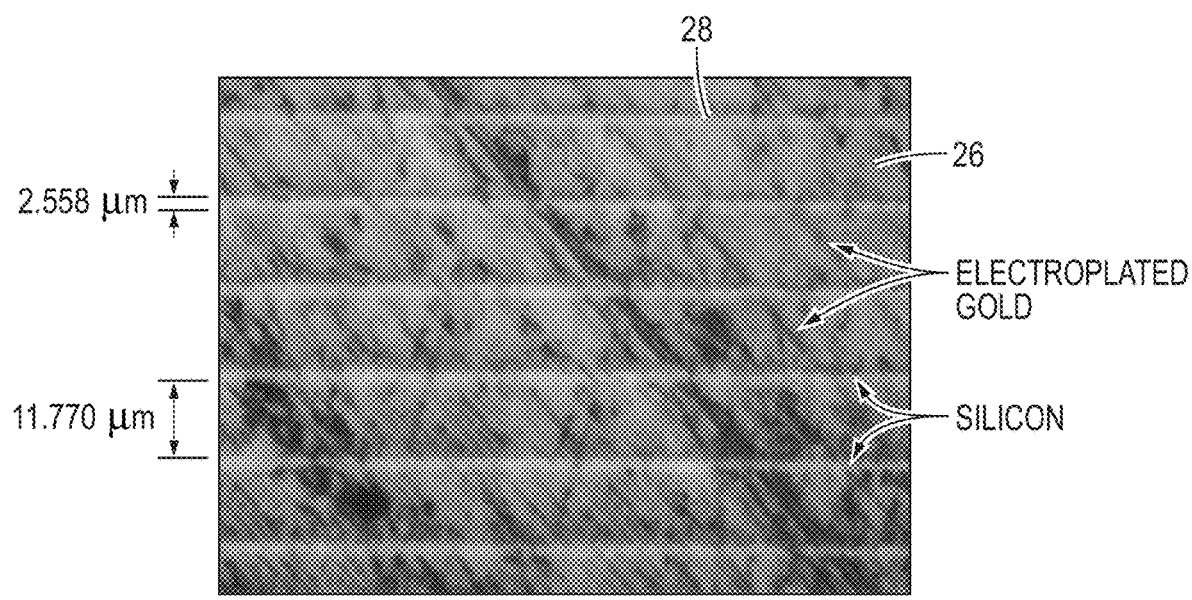
FIG. 7 shows a highly magnified image of a portion of a fabricated grating after removal of the gold overplate by CMP.

FIG. 7 shows a highly magnified image of a portion of a fabricated grating after removal of the gold overplate by CMP. The electroplated gold features 26 and the silicon sidewalls 28 are indicated in the figure. A measured grating pitch of 11.770 μm is indicated by an overlay in the figure. A measured sidewall thickness of 2.558 μm is also indicated in the figure.

Figure 8:
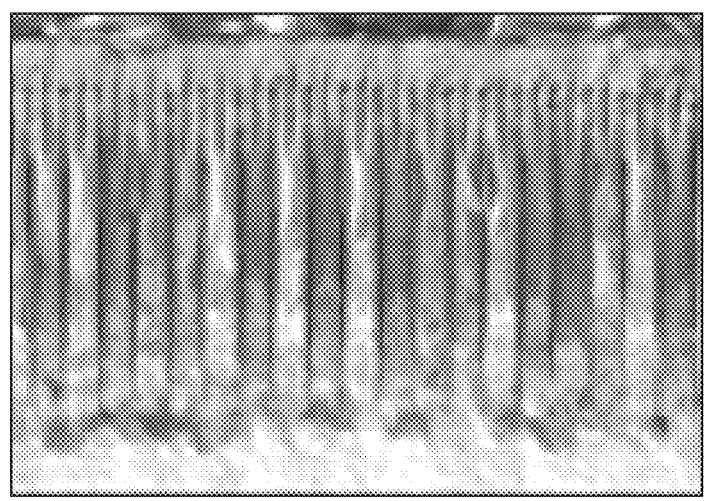
FIG. 8 is a scanning electron micrograph showing part of a processed wafer in cross section.

FIG. 8 is a scanning electron micrograph showing a processed wafer in cross section.

We claim:

1. A method for fabricating a metal grating in a silicon substrate having a thickness and first and second faces, comprising:
    lithographically defining a grating pattern comprising parallel elongated etch regions of equal widths on the first face, wherein the etch region width is smaller than the substrate thickness by a factor of 50 or more;
    etching the silicon substrate so as to create a multiplicity of through-etched trenches that extend all the way through the substrate;
    at the first or second face of the silicon substrate, plugging the through-etched trenches with electrodeposited metal; and
    filling the through-etched trenches with electrodeposited metal by growth from the plugged face.

2. The method of claim 1, wherein the etching of the silicon substrate comprises:
    etching the first face so as to create a multiplicity of parallel side-1 trenches extending from the first face partway into the substrate; and
    etching material away from the second face so as to expose bottom ends of the side-1 trenches, thereby to create a multiplicity of through-etched trenches that extend all the way through the substrate.

3. The method of claim 1, further comprising, before the through-etched trenches are plugged with electrodeposited metal, evaporatively depositing a metal layer as a seed layer for the plugging step.

4. The method of claim 3, further comprising, before depositing the seed layer, coating the through-etched trenches on inner walls thereof with a dielectric material.

5. The method of claim 4, wherein the dielectric material is aluminum dioxide, and wherein the coating is performed by atomic layer deposition.

6. The method of claim 1, wherein the electrodeposited metal that fills the through-etched trenches is gold.

7. The method of claim 1, wherein the through-etched trenches are at least 0.8 cm long, and wherein the grating pattern is at least 0.8 cm across.

8. The method of claim 1, wherein the through-etched trenches are at least 550 μm deep.

9. The method of claim 1, wherein the through-etched trenches have a pitch of 20 μm or less.

10. The method of claim 1, wherein the through-etched trenches are separated by silicon walls with a thickness of 5 μm or less.

* * * * *